US012677701B2

(12) United States Patent
Dong et al.

(10) Patent No.: US 12,677,701 B2
(45) Date of Patent: Jul. 7, 2026

(54) OPTICAL PATH STRUCTURE, OPTICAL PATH SYSTEM, AND TRANSFER METHOD

(71) Applicant: BOE Technology Group Co., Ltd., Beijing (CN)

(72) Inventors: Xue Dong, Beijing (CN); Guangcai Yuan, Beijing (CN); Xin Gu, Beijing (CN); Junwei Yan, Beijing (CN); Fei Wang, Beijing (CN); Xiao Zhang, Beijing (CN); Haixu Li, Beijing (CN); Xuan Liang, Beijing (CN); Chengfei Wang, Beijing (CN); Mingxing Wang, Beijing (CN); Shulei Li, Beijing (CN); Xiaolei Zhang, Beijing (CN); Xinxin Zhao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 811 days.

(21) Appl. No.: 18/016,589

(22) PCT Filed: Feb. 28, 2022

(86) PCT No.: PCT/CN2022/078381
§ 371 (c)(1),
(2) Date: Jan. 17, 2023

(87) PCT Pub. No.: WO2023/159590
PCT Pub. Date: Aug. 31, 2023

(65) Prior Publication Data
US 2024/0258279 A1 Aug. 1, 2024

(51) Int. Cl.
*H10W 90/00* (2026.01)
*H10H 20/01* (2025.01)
*H10P 72/50* (2026.01)

(52) U.S. Cl.
CPC .......... *H10W 90/00* (2026.01); *H10H 20/018* (2025.01); *H10P 72/53* (2026.01)

(58) Field of Classification Search
CPC .. H01L 25/0753; H01L 21/681; H10H 20/018
See application file for complete search history.

(56) References Cited

U.S. PATENT DOCUMENTS

| | | | | |
|---|---|---|---|---|
| 2004/0197433 A1* | 10/2004 | Terada | .................. | H01L 23/544 |
| | | | | 257/E23.179 |
| 2020/0343405 A1* | 10/2020 | Koyanagi | ............ | H10H 20/018 |

FOREIGN PATENT DOCUMENTS

| | | | |
|---|---|---|---|
| CN | 101882578 A | 11/2010 | |
| CN | 107030397 A | 8/2017 | |

(Continued)

OTHER PUBLICATIONS

CN 113284989 A (Jia, Li-qin et al.) machine translation (Year: 2021).*

(Continued)

*Primary Examiner* — James A Dudek
(74) *Attorney, Agent, or Firm* — WHDA, LLP

(57) ABSTRACT

An optical path structure, an optical path system, and a transfer method. The optical path structure includes a beam adjustment module configured to adjust a diameter of a laser beam and output a first beam; a beam shaping module configured to perform energy homogenization on the first beam to obtain a second beam; and a beam focusing module configured to focus the second beam and output a target light spot; the target light spot is used for irradiating a device substrate, so that a bonding material in the device substrate changes after being irradiated by the target light spot, and a target device is separated from a carrier substrate; where the bonding material is disposed between the target device and the carrier substrate.

18 Claims, 9 Drawing Sheets

(56) References Cited

FOREIGN PATENT DOCUMENTS

| CN | 209231614 U | 8/2019 |
| CN | 111745301 A | 10/2020 |
| CN | 112967975 A | 6/2021 |
| CN | 113284989 A | 8/2021 |
| CN | 215118903 U | 12/2021 |

OTHER PUBLICATIONS

CN 209231614 U (Wang, Jian-Gang et al.) machine translation (Year: 2019).*

* cited by examiner a            b

OPTICAL PATH STRUCTURE, OPTICAL PATH SYSTEM, AND TRANSFER METHOD

CROSS-REFERENCE TO RELATED APPLICATIONS

The present application is a national phase application under 35 U.S.C. § 371 of International Patent Application No. PCT/CN2022/078381 filed on Feb. 28, 2022, the contents of which are incorporated by reference in its entirety herein.

TECHNICAL FIELD

The present disclosure relates to the field of optical technology, and in particular to an optical path structure, an optical path system, and a transfer method.

BACKGROUND

Compared with a liquid crystal display screen, an organic light emitting diode (LED) display screen has obvious advantages in terms of image quality, refresh frequency, power consumption, brightness, etc. Due to these advantages, LED display is widely applied in traditional display, near-to-eye display, 3D display, transparent display and the like.

SUMMARY

The present disclosure provides an optical path structure, including:

a beam adjustment module configured to adjust a diameter of a laser beam and output a first beam;

a beam shaping module configured to perform energy homogenization on the first beam to obtain a second beam; and a beam focusing module configured to focus the second beam and output a target light spot; the target light spot is used for irradiating a device substrate, allowing a target device to be separated from a carrier substrate because a bonding material, after being irradiated by the target light spot, in the device substrate changes; and the bonding material is disposed between the target device and the carrier substrate.

In an optional implementation, the beam adjustment module is a beam expander or a beam reducer.

In an optional implementation, the beam shaping module includes at least one of a optical diffractive element, a optical refractive element, and a optical reflective element.

In an optional implementation, the beam focusing module is a focusing lens or a lens group consisting of a plurality of focusing lenses.

In an optional implementation, the optical path structure further includes:

a position adjustment module disposed between the beam adjustment module and the beam shaping module, or disposed between the beam shaping module and the beam focusing module, or disposed on a light emitting side of the beam focusing module; and the position adjustment module is configured to change a propagation direction of a beam incident to the position adjustment module so that an orthographic projection of the target light spot on the device substrate covers the target device.

In an optional implementation, the position adjustment module includes an optical reflective element.

In an optional implementation, the optical path structure further includes at least one of following components:

a laser device configured to generate the laser beam;

at least one direction adjustment module disposed between the beam adjustment module and the beam shaping module and configured to adjust a propagation direction of the first beam; and an energy adjustment module disposed between the beam adjustment module and the beam shaping module and configured to adjust energy of the first beam.

In an optional implementation, the direction adjustment module includes a reflective mirror; and/or the energy adjustment module includes a half-wave plate and a polarizing beam splitter.

In an optional implementation, the size of the target light spot is greater than the size of the target device, and a boundary of the orthographic projection of the target light spot on the device substrate is protruded by a preset threshold relative to a boundary of the target device;

where the preset threshold is greater than or equal to zero and less than or equal to a half of a distance between the target device and an adjacent device, and the adjacent device is a device adjacent to the target device in the device substrate.

In an optional implementation, an energy density of the target light spot is greater than or equal to a first energy density and less than a second energy density;

where the first energy density is an energy density enabling the bonding material to be decomposed or gasified, and the second energy density is an energy density enabling the bonding material to be denatured.

The present disclosure provides an optical path system, including the optical path structure according to any one mentioned above.

In an optional implementation, the optical path system includes M optical path structures and M-level optical switches cascaded with each other, the M optical path structures share the beam adjustment module, the various levels of optical switches are respectively disposed in the different optical path structures, and each level of optical switch includes an input terminal, a first output terminal, and a second output terminal;

where an input terminal of a first-level optical switch is connected to an output terminal of the beam adjustment module, and a first output terminal of the first-level optical switch is connected to a beam shaping module in an optical path structure to which the first-level optical switch belongs; an input terminal of an $i^{th}$-level optical switch is connected to a second output terminal of an $(i-1)^{th}$-level optical switch, a first output terminal of the $i^{th}$-level optical switch is connected to a beam shaping module in an optical path structure to which the $i^{th}$-level optical switch belongs, and a second output terminal of the $i^{th}$-level optical switch is connected to an input terminal of an $(i+1)^{th}$-level optical switch; a first output terminal of an $M^{th}$-level optical switch is connected to a beam shaping module in an optical path structure to which the $M^{th}$-level optical switch belongs; and M is a positive integer greater than 1, and i is greater than or equal to 2 and less than or equal to M−1.

In an optional implementation, each of the optical switches is a reflective mirror, or a half-wave plate and polarizing beam splitter, or a half-wave plate and metal wire grid polarizer.

In an optional implementation, the optical path system includes a beam splitting module and N optical path structures, wherein the N optical path structures share the beam adjustment module and the beam splitting module;

where the beam splitting module is disposed between the beam adjustment module and the beam shaping module in each of the optical path structures and is configured to split the first beam into N sub-beams and enable each of the sub-beams to respectively enter the beam shaping modules in the different optical path structures, wherein N is a positive integer greater than 1.

In an optional implementation, the beam splitting module is a diffractive beam splitter.

In an optional implementation, the plurality of optical path structures sharing the beam adjustment module form a subsystem, and the optical path system includes a plurality of the subsystems.

The present disclosure provides a transfer method adopting the optical path system according to any one mentioned above, and the transfer method including:

providing a device substrate, the device substrate including a target device, a carrier substrate, and a bonding material disposed between the target device and the carrier substrate; and controlling the optical path system to output a target light spot to irradiate the device substrate, allowing the target device to be separated from the carrier substrate because the bonding material, after being irradiated by the target light spot, in the device substrate changes.

In an optional implementation, the controlling the optical path system to output a target light spot to irradiate the device substrate includes at least one of:

adjusting the size and position of the target light spot, allowing an orthographic projection of the target light spot on the device substrate to cover the target device and not overlap with other components on the device substrate; and adjusting the energy of the target light spot so that the energy density of the target light spot is greater than or equal to a first energy density and less than a second energy density; wherein the first energy density is an energy density enabling the bonding material to be decomposed or gasified, and the second energy density is an energy density enabling the bonding material to be denatured.

In an optional implementation, the optical path system includes M optical path structures and M-level optical switches cascaded with each other, the M optical path structures share the beam adjustment module, the M-level optical switches are respectively disposed in the M optical path structures, and each level of optical switch includes an input terminal, a first output terminal, and a second output terminal; wherein an input terminal of a first-level optical switch is connected to an output terminal of the beam adjustment module, and a first output terminal of the first-level optical switch is connected to a beam shaping module in an optical path structure to which the first-level optical switch belongs; an input terminal of an $i^{th}$-level optical switch is connected to a second output terminal of an $(i-1)^{th}$-level optical switch, a first output terminal of the $i^{th}$-level optical switch is connected to a beam shaping module in an optical path structure to which the $i^{th}$-level optical switch belongs, and a second output terminal of the $i^{th}$-level optical switch is connected to an input terminal of an $(i+1)^{th}$-level optical switch; a first output terminal of an $M^{th}$-level optical switch is connected to a beam shaping module in an optical path structure to which the $M^{th}$-level optical switch belongs; M is a positive integer greater than 1, and i is greater than or equal to 2 and less than or equal to M−1; and the optical switches are reflective mirrors, or the optical switches are half-wave plates and polarizing beam splitters, or the optical switches are half-wave plates and metal wire grid polarizers, and the step of controlling the optical path system to output a target light spot includes:

acquiring position information of the target device; and controlling each of the optical switches to operate in a first state or a second state according to the position information;

where in the first state, an input terminal and a first output terminal of the optical switches are connected, and the input terminal and a second output terminal of the optical switches are disconnected; and in the second state, the input terminal and the first output terminal of the optical switches are disconnected, and the input terminal and the second output terminal of the optical switches are connected.

In an optional implementation, the optical path system includes M optical path structures and M-level optical switches cascaded with each other, the M optical path structures share the beam adjustment module, the various levels of optical switches are respectively disposed in the different optical path structures, and each level of optical switch includes an input terminal, a first output terminal, and a second output terminal; wherein an input terminal of a first-level optical switch is connected to an output terminal of the beam adjustment module, and a first output terminal of the first-level optical switch is connected to a beam shaping module in an optical path structure to which the first-level optical switch belongs; an input terminal of an $i^{th}$-level optical switch is connected to a second output terminal of an $(i-1)^{th}$-level optical switch, a first output terminal of the $i^{th}$-level optical switch is connected to a beam shaping module in an optical path structure to which the $i^{th}$-level optical switch belongs, and a second output terminal of the $i^{th}$-level optical switch is connected to an input terminal of an $(i+1)^{th}$-level optical switch; a first output terminal of an $M^{th}$-level optical switch is connected to a beam shaping module in an optical path structure to which the $M^{th}$-level optical switch belongs; M is a positive integer greater than 1, and i is greater than or equal to 2 and less than or equal to M−1; and the optical switches are half-wave plates and polarizing beam splitters, or the optical switches are half-wave plates and metal wire grid polarizers, and the step of controlling the optical path system to output a target light spot includes:

acquiring position information of the target device; and controlling each of the optical switches to operate in a first state, a second state or a third state according to the position information;

where in the first state, an input terminal and a first output terminal of the optical switches are connected, and the input terminal and a second output terminal of the optical switches are disconnected; in the second state, the input terminal and the first output terminal of the optical switches are disconnected, and the input terminal and the second output terminal of the optical switches are connected; and in the third state, the input terminal and the first output terminal of the optical switches are connected, and the input terminal and the second output terminal of the optical switches are connected.

The above-mentioned description is merely an overview of the technical solutions of the present disclosure. In order to know about the technical means of the present disclosure more clearly and implement the solutions according to the contents of the specification, and in order to make the above-mentioned and other objectives, features and advantages of the present disclosure more apparent and understandable, specific implementations of the present disclosure are set forth below.

BRIEF DESCRIPTION OF THE DRAWINGS

In order to describe the embodiments of the present disclosure or the technical solutions in the related art more clearly, the accompanying drawings which are used in the description of the embodiments or the related art will be briefly introduced. Apparently, the accompanying drawings in the following description are some embodiments of the present disclosure, and those skilled in the art may obtain other accompanying drawings according to these accompanying drawings without paying any creative effort. It should be noted that scales shown in the accompanying drawings are merely schematic and do not represent actual scales.

DETAILED DESCRIPTION OF THE EMBODIMENTS

In order to make the objectives, technical solutions and advantages of the embodiments of the present disclosure clearer, a clear and complete description for the technical solutions in the embodiments of the present disclosure will be given below in conjunction with the accompanying drawings in the embodiments of the present disclosure. Apparently, the described embodiments are a part of embodiments of the present disclosure, not all the embodiments. Based on the embodiments in the present disclosure, all other embodiments obtained by those skilled in the art without paying creative effort fall within the protection scope of the present disclosure.

Figure 1:
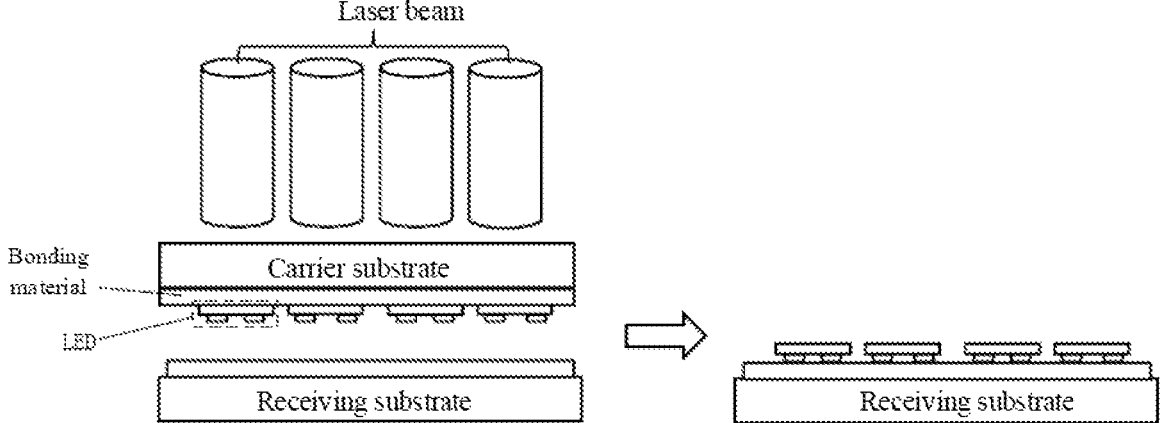
FIG. 1 is schematic diagram illustrating performing laser transfer on a device.

Referring to FIG. 1, an LED generally grows on a sapphire substrate (such as a carrier substrate in FIG. 1), and then, the LED is transferred to a medium carrier substrate or a back plane including a driving circuit (such as a receiving substrate in FIG. 1) by a laser transfer technology. If the LED is first transferred to the medium carrier substrate, the LED may be subsequently transferred to the back plane by a process such as stamping, electrostatic, transfer printing or laser.

The laser transfer technology is a process in which a bonding material between the LED and the carrier substrate is decomposed or gasified under the action of a laser beam, so that the LED is separated from the carrier substrate, and then, the LED is transferred to a receiving substrate.

However, the laser transfer technology has many problems in a practical application, such as mismatch between the size of a laser spot and the size of the LED and poor energy uniformity of the laser spot.

Figure 2:
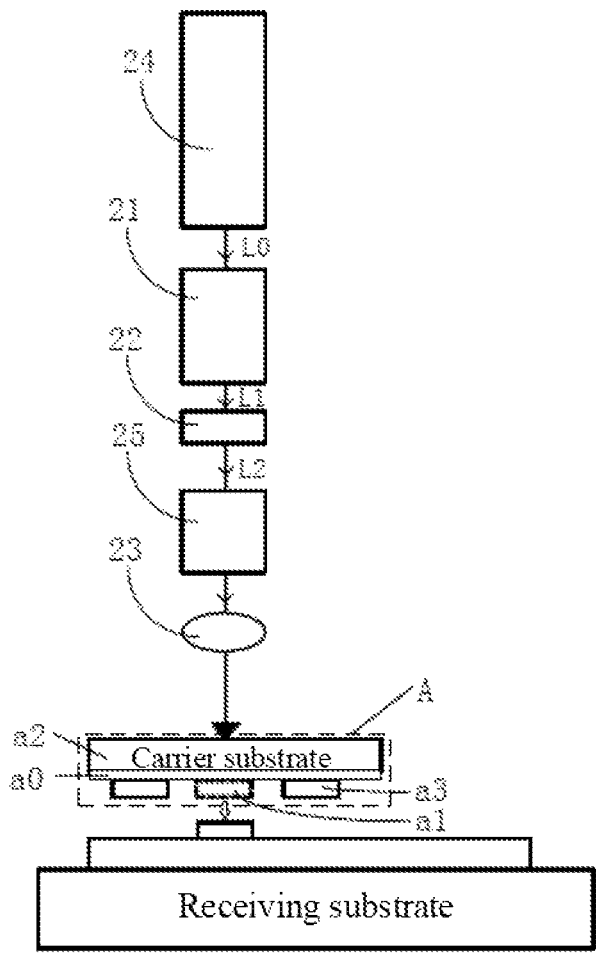
FIG. 2 is a schematic diagram illustrating a first optical path structure provided by the present disclosure.

In order to solve the above-mentioned problems, the present disclosure provides an optical path structure. FIG. 2 is a schematic diagram illustrating an optical path structure. As shown in FIG. 2, the optical path structure includes: a beam adjustment module 21, a beam shaping module 22, and a beam focusing module 23.

The beam adjustment module 21 is configured to adjust a diameter of an initial beam L0 and output a first beam L1.

The beam shaping module 22 is configured to perform energy homogenization on the first beam L1 to obtain a second beam L2.

The beam focusing module 23 is configured to focus the second beam L2 to output a target light spot. The target light spot may be used for irradiating a device substrate A, so that bonding material a0 in the device substrate 'A' changes after being irradiated by the target light spot, and then, a target device a1 is separated from a carrier substrate a2.

In a specific implementation, as shown in FIG. 2, the initial beam L0 may be a laser beam generated by a laser device 24. The laser device 24 may be located in the above-mentioned optical path structure (as shown in FIG. 2) or may be located outside the above-mentioned optical path structure, which is not limited in the present disclosure.

The laser device 24 may be a solid-state laser device, a gas laser device, or a semiconductor laser device, etc. The wavelength and power of the initial beam L0 may be determined according to a specific material of the bonding material a0, and are not limited in the present disclosure.

The light spot of the initial beam L0 directly emitted by the laser device 24, i.e. an initial light spot, is generally approximately circular, and the diameter of the circle varies from several hundreds of micrometers to several millimeters. The energy of the initial light spot is generally in Gaussian distribution, i.e. the energy at the center of a circle of the initial light spot is the highest, the energy at an edge is the lowest, and therefore, the energy uniformity is relatively poor.

Since the size of the initial light spot directly emitted by the laser device 24 is mismatched with the size of the device and the energy uniformity is relatively poor, the initial beam L0 directly emitted by the laser device 24 may not be applied to the transfer of the device.

In the present disclosure, the diameter of the initial beam L0 may be increased or reduced by disposing the beam adjustment module 21, so that the first beam L1 output meets a requirement for a light entrance aperture of the beam shaping module 22. The first beam L1 may be a parallel beam.

The beam shaping module 22 may adjust the phase, etc. of the first beam L1, thereby achieving energy homogenization on the first beam L1 and outputting the second beam L2. The second beam L2 may be a parallel beam.

The beam focusing module 23 is configured to receive the second beam L2 and enable the second beam L2 to focus, so that the size of the output light spot may be adjusted to form the target light spot. The target light spot may be used for irradiating the device substrate A.

In the device substrate A, the bonding material a0 is disposed between a target device a1 and a carrier substrate a2. Before being irradiated by the target light spot, the target device a1 is bonded to the carrier substrate a2 via the bonding material a0; and after being irradiated by the target light spot, the target device a1 is separated from the carrier substrate a2 due to a change such as decomposition or gasification of the bonding material a0. As shown in FIG. 2, the device substrate may further include other devices a3, where the other devices a3 are devices that are not irradiated by the target light spot in the device substrate A, and the target device a1 is a device that is irradiated by the target light spot in the device substrate A and falls off from the carrier substrate a2 to the receiving substrate.

According to the optical path structure provided by the present disclosure, the initial beam L0 sequentially passes through the beam adjustment module 21, the beam shaping module 22 and the beam focusing module 23, and the size and energy of the laser beam are adjusted and optimized, so that the target light spot that has a size matched with the size of the target device and has high energy uniformity may be finally output.

In the present disclosure, the device may be a light emitting device such as an LED, and may also be other miniature electronic devices, etc., which is not limited in the present disclosure.

When the device is the light emitting device such as the LED, the device substrate is a light emitting substrate. As an example, the LED is taken as the device and the light emitting substrate is taken as the device substrate in the following embodiments.

Optionally, the beam adjustment module 21 may be a beam expander or a beam reducer.

The beam expander may include a concave lens and a convex lens. The initial beam L0 enters the concave lens, and a divergence angle of an emergent beam of the concave lens is increased, so that the size of an emergent light spot is increased; and then, the beam is converged into parallel light by the convex lens, thereby achieving the objective of increasing the diameter of the initial beam L0.

The structure of the beam reducer may include a convex lens and a concave lens. The initial beam L0 sequentially passes through the convex lens and the concave lens, thereby achieving the objective of reducing the diameter of the initial beam L0.

Optionally, the beam shaping module 22 may include at least one of an optical diffractive element, an optical refractive element, and an optical reflective element.

The optical diffractive element may be two-dimensionally distributed diffraction units formed by a micro-nano etching process, and each of the diffraction units may have a specific shape, refractive index, etc. and may finely regulate and control the laser wavefront phase distribution. An incident beam is diffracted after passing through each diffraction unit, and interference may occur on a light emitting side, so that a specific light intensity distribution may be formed. Therefore, the uniform energy distribution may be achieved by adopting the optical diffractive element.

Specifically, the optical diffractive element may be a flat top beam generator, a beam homogenizer, etc. The optical refractive element may specifically include a spherical lens, a cylindrical lens, etc. The optical reflective element may include a reflective mirror such as a vibrating mirror and a rotating mirror.

Optionally, the beam focusing module 23 is a focusing lens, or a lens group consisting of a plurality of focusing lenses.

In order to adjust the position of the target light spot, as shown in FIG. 2, the above-mentioned optical path structure may further include a position adjustment module 25. The position adjustment module 25 may be configured to change a propagation direction of a beam incident to the position adjustment module 25 so that an orthographic projection of the target light spot on the device substrate A covers the target device a1.

In a specific implementation, the position adjustment module 25 may be disposed between the beam adjustment module 21 and the beam shaping module 22, or disposed between the beam shaping module 22 and the beam focusing module 23 (as shown in FIG. 2), or disposed on the light emitting side of the beam focusing module 23.

By disposing the position adjustment module 25, the alignment between an irradiation position of the target light spot and the position of the target device a1 may be achieved. The target light spot may irradiate a position corresponding to the target device a1 on the device substrate under the action of the position adjustment module 25, thereby acting on the bonding material a0 on the position; and the bonding material a0 is decomposed or gasified under the action of the target light spot, so that the target device a1 may be separated from the carrier substrate a2.

In a specific implementation, the position adjustment module 25 may include any optical element, such as an optical reflective element, capable of adjusting the propagation direction of the beam. Specifically, the optical reflective element may include one or more reflective mirrors. The optical reflective element may be controlled electrically or manually or mechanically. The reflective mirror may be specifically a vibrating mirror, a rotating mirror, etc.

Figure 3:
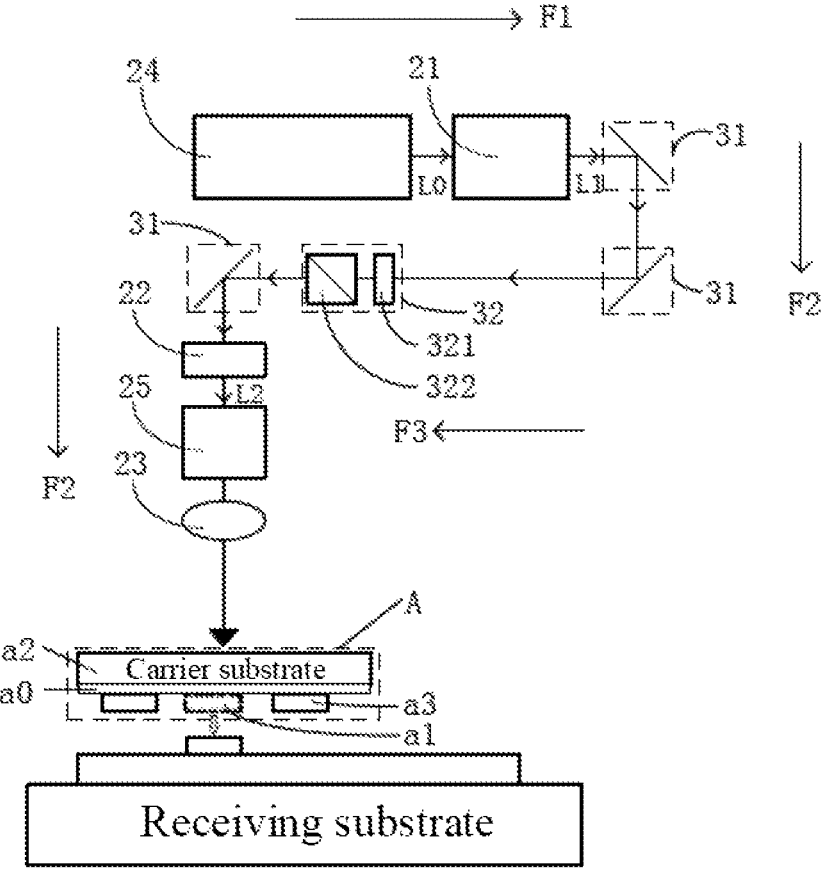
FIG. 3 is a schematic diagram illustrating a second optical path structure provided by the present disclosure.

In order to reduce the space occupied in a vertical direction of the optical path structure shown in FIG. 2, optionally, as shown in FIG. 3, the above-mentioned optical path structure may further include at least one direction adjustment module 31.

The direction adjustment module 31 may be disposed between the beam adjustment module 21 and the beam shaping module 22 and is configured to adjust a propagation direction of the first beam L1.

Optionally, the direction adjustment module 31 may include any optical element, such as a reflective mirror, capable of changing the propagation direction of the beam.

As shown in FIG. 3, three reflective mirrors are disposed between the beam adjustment module 21 and the beam shaping module 22. In an optical path shown in FIG. 3, for each reflective mirror, a deflection angle between an incident beam and a reflected beam is ninety degrees, and an incident angle and a reflection angle are both forty-five degrees.

As shown in FIG. 3, the propagation direction of the first beam L1 is a first direction F1, and after the first beam passes through a first reflective mirror, the propagation direction is deflected by ninety degrees to reach a second direction F2; after the beam passes through a second reflective mirror, the propagation direction is further deflected by ninety degrees to reach a third direction F3; and then, after the beam passes through a third reflective mirror, the propagation direction is deflected by ninety degrees again to reach the second direction F2. The third direction F3 and the first direction F1 are reverse.

By disposing the direction adjustment modules 31, the laser device and the beam adjustment module 21 may be placed in the first direction F1 (as a horizontal direction in FIG. 3), and after the first beam L1 passes through each direction adjustment module 31, a ray propagated in the second direction F2 is formed and is finally incident to the beam shaping module 22. Such a structure may reduce the space occupied in the second direction, i.e. the vertical direction shown in FIG. 3.

In order to adjust the energy of the target light spot, the above-mentioned optical path structure may further include an energy adjustment module 32 configured to adjust the energy of the first beam L1 and then adjust the energy of the target light spot.

As shown in FIG. 3, the energy adjustment module 32 may be disposed between the beam adjustment module 21 and the beam shaping module 22.

When the optical path structure further includes a plurality of reflective mirrors, the energy adjustment module 32 may be disposed between two reflective mirrors, as shown in FIG. 3. Further, the energy adjustment module 32 may be disposed on a path where the ray is propagated in the first direction F1 or the third direction F3, and thus, the space occupied in the vertical direction may be further reduced. The energy adjustment module 32 as shown in FIG. 3 is disposed on a path where the ray is propagated in the third direction F3.

In a specific implementation, the energy adjustment module 32 may include a half-wave plate 321 and a polarizing beam splitter 322. When the ray passes through the half-wave plate 321, a polarization direction of part of light may be changed; and then, this part of light may be filtered by the polarizing beam splitter 322, so that the energy adjustment of the target light spot is achieved.

In a specific implementation, the above-mentioned optical path structure may further include an element such as an acousto-optic modulator or an electro-optic modulator which may control an optical path to be turned on or off.

Figure 4:
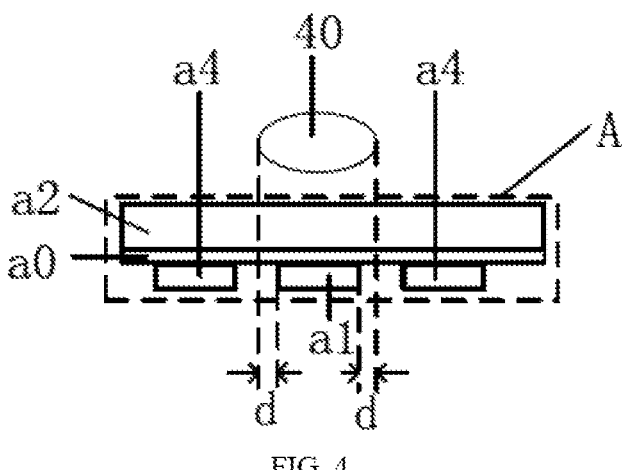
FIG. 4 is a schematic structural diagram of a target light spot and a target device.

In order to achieve a complete separation between the target device a1 and the carrier substrate a2, referring to FIG. 4, the size of the target light spot 40 may be greater than the size of the target device a1, and a boundary of the orthographic projection of the target light spot on the device substrate A is protruded by a preset threshold 'd' relative to a boundary of the target device a1.

The preset threshold 'd' may be greater than or equal to zero and less than or equal to a half of a distance between the target device a1 and an adjacent device a4, and the adjacent device a4 is a device next to the target device a1 in the device substrate A.

The distance between the target device a1 and the adjacent device a4 is the minimum distance between the target device a1 and the adjacent device a4. The size of the target light spot 40 is the size of the orthographic projection of the target light spot 40 on the device substrate A, i.e. the size of the target light spot 40 in a direction parallel to a plane where the device substrate A is located. The size of the target device a1 is the size of the target device a1 in the direction parallel to the plane where the device substrate A is located.

As shown in FIG. 4, the orthographic projection of the target light spot 40 on the device substrate A may completely cover the target device a1 and does not overlap with the adjacent device a4 in the device substrate A. In this way, not only may it be ensured that the target device a1 is completely separated from the carrier substrate a2, but also it may be ensured that the adjacent device a4 is not affected by the target light spot 40.

The LEDs include mini light emitting diodes (Mini LED for short) and micro light emitting diodes (Micro LED for short). The size of the Mini LED is about 100 micrometers to three hundreds micrometers. The size of the Micro LED is about 100 micrometers or less.

When the size of each device in the device substrate A is 100 micrometers×100 micrometers, and the minimum distance between two adjacent devices is 50 micrometers, a value range of the corresponding preset threshold 'd' may be greater than or equal to zero and less than or equal to 25 micrometers.

Therefore, the size of the target light spot 40 may be 100 micrometers×100 micrometers, and the corresponding preset threshold d is zero; the size of the target light spot 40 may also be 120 micrometers×120 micrometers, and the corresponding preset threshold d is 20 micrometers; and the size of the target light spot 40 may also be one 125 micrometers×125 micrometers, and the corresponding preset threshold d is 25 micrometers.

When the preset threshold d is equal to zero, the size of the target light spot 40 is equal to the size of the target device a1; and when the preset threshold d is greater than zero, the size of the target light spot 40 is greater than the size of the target device a1.

It should be noted that, in a specific implementation, the size of the target light spot 40 may also be set to be less than the size of the target device a1 according to a practical requirement, for example, the boundary of the orthographic projection of the target light spot on the device substrate A is indented with respect to the boundary of the target device a1, etc. In this case, the position adjustment module 25 is configured to change the propagation direction of the beam incident to the position adjustment module 25 so that the orthographic projection of the target light spot on the device substrate falls within a range where the target device is located.

Figure 5:
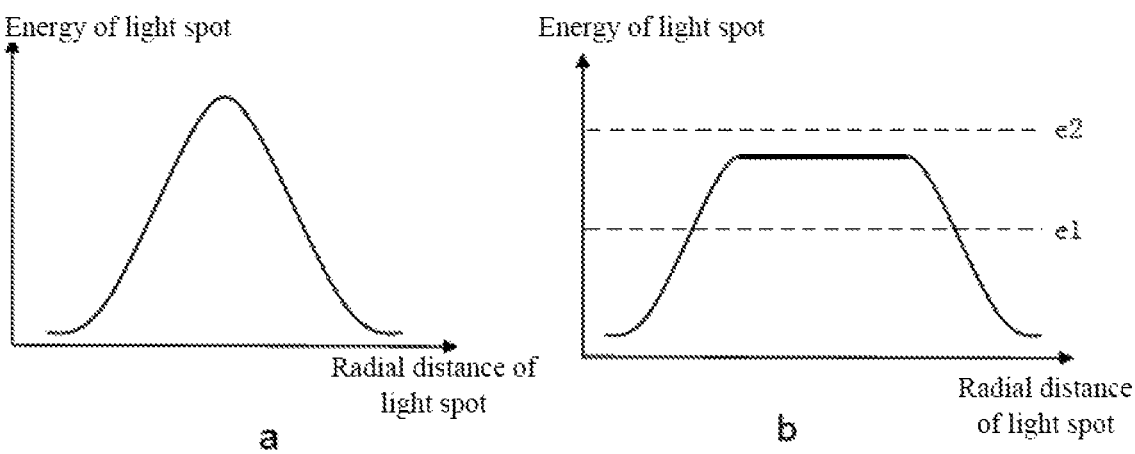
FIG. 5 is a schematic diagram illustrating energy distribution of two light spots.

Referring to FIG. 5, an energy density of the target light spot may be greater than or equal to a first energy density e1 and less than a second energy density e2. The first energy density e1 is an energy density enabling the bonding material a0 to be decomposed or gasified, and the second energy density e2 is an energy density enabling the bonding material a0 to be denatured.

The energy density of the target light spot may specifically refer to an energy density at each position of the target light spot formed by single laser pulse. The energy density enabling the bonding material a0 to be denatured may specifically refer to an energy density enabling the bonding material a0 to be carbonized.

In a specific implementation, by adjusting the energy distribution of the light spot from Gaussian distribution (as shown in the graph 'a' in FIG. 5) to a flat top beam (as shown in the graph 'b' in FIG. 5), the energy density at each position of the target light spot may fall within a range from the first energy density e1 to the second energy density e2, thereby ensuring that the energy uniformity of the target light spot meets the requirement for the decomposition or gasification of the bonding material a0.

The above-mentioned gasification refers to a process that the bonding material is decomposed under the irradiation of the target light spot to generate a gas (i.e. a decomposition product includes the gas). Specifically, when the bonding material is a bonding adhesive, the energy of the target light spot may break chemical bond of a polymer in the bonding adhesive so that the polymer is decomposed to generate a gas, and the above-mentioned gasification may be a process that the bonding adhesive is decomposed to generate a gas. When the bonding material is GaN at a junction of the sapphire substrate and a GaN epitaxial layer, the GaN bonding material absorbs energy of photons under the action of the target light spot so as to be decomposed into liquid Ga and nitrogen, and the above-mentioned gasification may be a process that the GaN bonding material is decomposed to generate nitrogen.

The present disclosure further provides an optical path system, including the optical path structure provided according to any one mentioned above.

Those skilled in the art may understand that the optical path system has the advantages of the previous optical path structure.

In a specific implementation, the optical path system may further include a base station, an alignment unit, a loading and unloading unit, etc. The base station may be configured to place a device substrate A, a receiving substrate, etc. The alignment unit may be configured to perform positional alignment between the device substrate 'A' and the receiving substrate. The loading and unloading unit may be configured to load and unload the device substrate A, the receiving substrate, etc. in the optical path system.

In a specific implementation, the optical path system may include one or more optical path structures. It is found that, when the optical path system merely includes a single optical path structure, in order to ensure that the size of the target light spot is matched with the size of the target device and ensure that the energy uniformity requirement is met, the irradiation range of the target light spot may be merely controlled within a range of 5 centimeters×5 centimeters. That is, the maximum area for one laser transfer of the device on the device substrate A is 5 centimeters×5 centimeters. Thus, when the area of the receiving substrate is large, the optical path system needs to repeatedly perform the process of loading the device substrate A, aligning the device substrate A with the receiving substrate and performing laser transfer.

Figure 6:
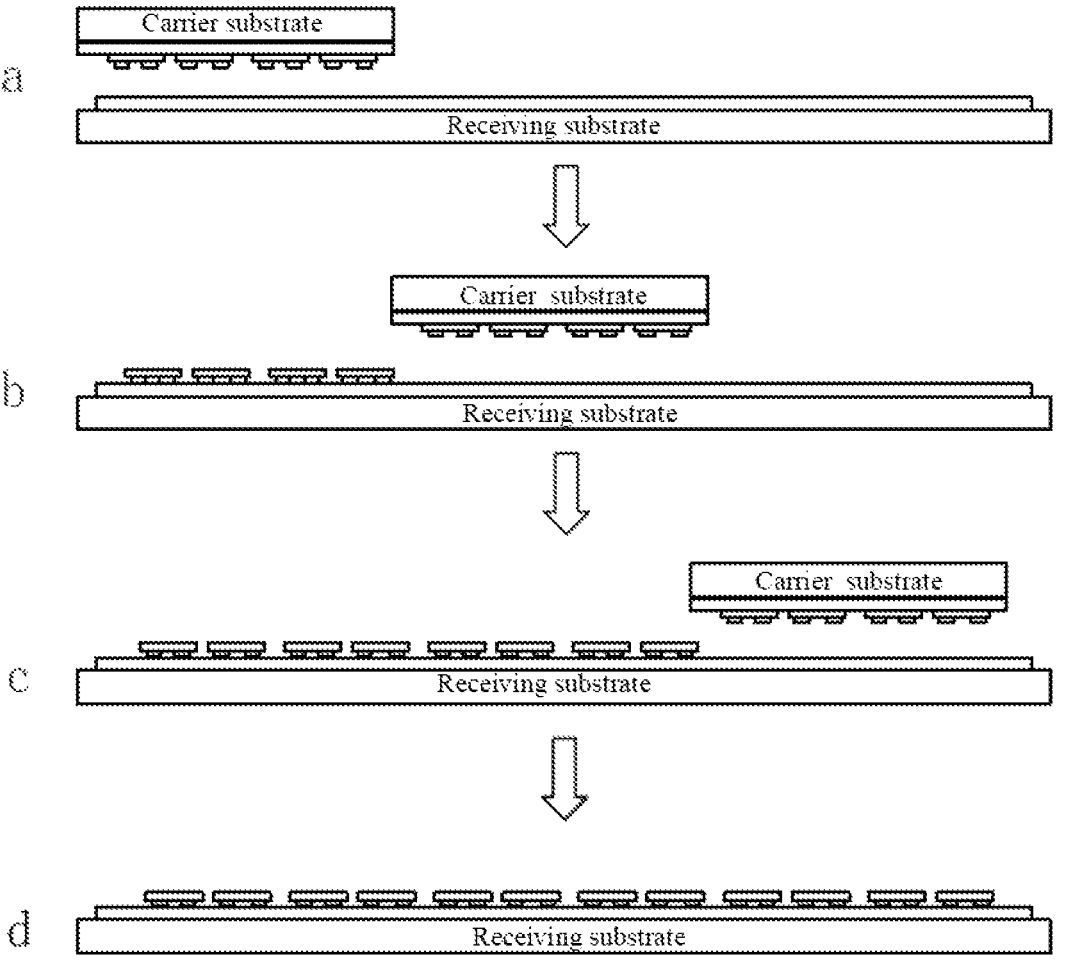
FIG. 6 is a schematic diagram illustrating a laser transfer process.

As shown in FIG. 6, graph 'a' is a schematic view of a first process of loading the device substrate A, aligning the device substrate A with the receiving substrate and performing laser transfer, graph 'b' is a schematic view of a second process of loading the device substrate A, aligning the device substrate A with the receiving substrate and performing laser transfer, graph 'c' is a schematic view of a third process of loading the device substrate A, aligning the device substrate A with the receiving substrate and performing laser transfer, and graph 'd' is a schematic view illustrating the receiving substrate obtained after the laser transfer is completed.

As can be seen, the optical path system formed by a single optical path structure has lower transfer efficiency due to the small area of one transfer.

In order to increase the area of one transfer and increase the transfer efficiency, the optical path system may include a plurality of optical path structures.

When the optical path system includes a plurality of optical path structures 80, devices on the device substrate A may be transferred according to the following process steps.

In step 1, a plurality of small-area device substrates A (as shown in Graph 'a' in FIG. 7) or a large-area device substrate A (as shown in Graph 'b' in FIG. 7) and the receiving substrate are placed on the base station of the optical path system.

In step 2, the device substrate A is aligned with the receiving substrate.

In step 3, the target light spot is output to complete the transfer of the devices.

Figure 7:
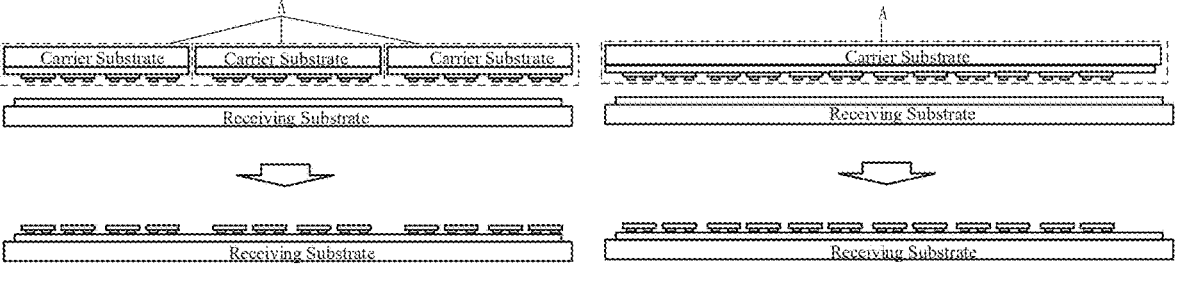
FIG. 7 is a schematic diagram illustrating another laser transfer process.

By disposing a plurality of optical path structures in the optical path system, each optical path structure may output one target light spot, and therefore, the optical path system may output a plurality of target light spots at the same time. Therefore, the optical path system may transfer the devices on the plurality of small-area device substrates A or the large-area device substrate A at the same time by one process of loading the device substrate A, aligning the device substrate A with the receiving substrate and performing laser transfer, as shown in FIG. 7. Therefore, the optical path system consisting of the plurality of optical path structures may increase the area of a single laser transfer, increase the transfer efficiency and reduce the transfer cost.

In a specific implementation, there are various implementations for disposing the plurality of optical path structures in the optical path system.

Figure 8:
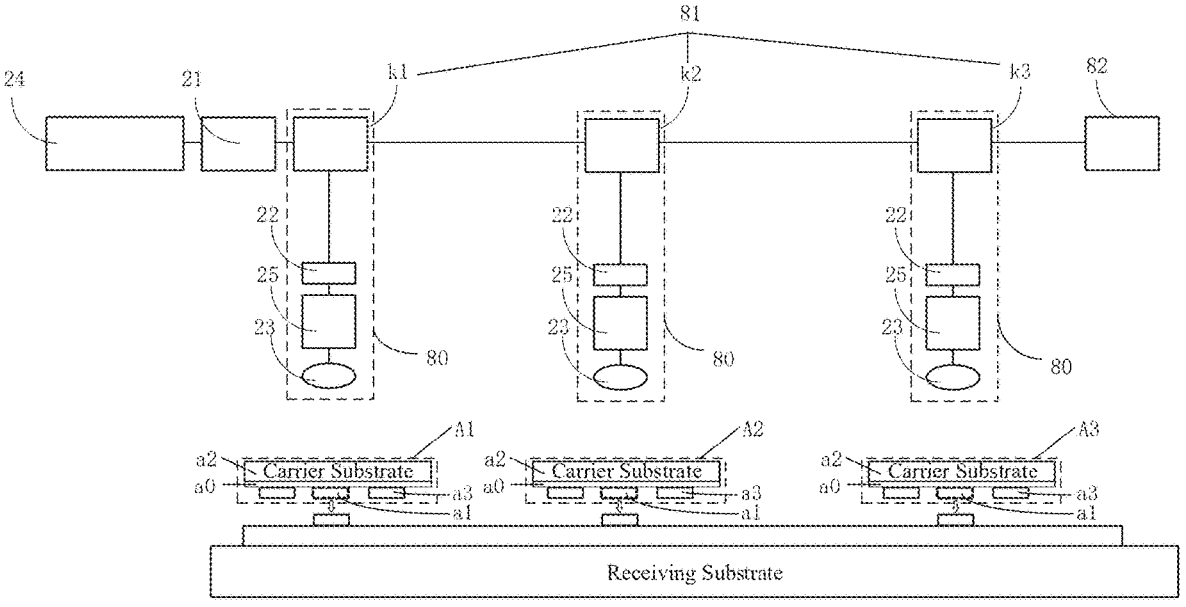
FIG. 8 is a schematic structural diagram illustrating a first optical path system provided by the present disclosure.

In a first implementation, as shown in FIG. 8, the optical path system includes M optical path structures 80 and M-level optical switches 81 cascaded with each other, the M optical path structures 80 share the beam adjustment module 21, the various levels of optical switches 81 are respectively disposed in different optical path structures 80, and each level of optical switch 81 includes an input terminal, a first output terminal, and a second output terminal. M may be a positive integer greater than 1.

In the optical path system shown in FIG. 8, M is 3, i.e. the optical path system includes three optical path structures 80.

An input terminal of a first-level optical switch k1 is connected to an output terminal of the beam adjustment module 21, and a first output terminal of the first-level optical switch k1 is connected to the beam shaping module 22 in the optical path structure 80 to which the first-level optical switch k1 belongs. A second output terminal of the first-level optical switch k1 is connected to an input terminal of a second-level optical switch k2.

An input terminal of an $i^{th}$-level optical switch k1 is connected to a second output terminal of an $(i-1)^{th}$-level optical switch k(i−1), a first output terminal of the $i^{th}$-level optical switch ki is connected to the beam shaping module 22 in the optical path structure 80 to which the $i^{th}$-level optical switch ki belongs, and a second output terminal of the $i^{th}$-level optical switch ki is connected to an input terminal of an $(i+1)^{th}$-level optical switch k(i+1). That is, a second output terminal of a former-level optical switch 81 is connected to an input terminal of a next-level optical switch 81, where i may be greater than or equal to 2 and less than or equal to M−1. In FIG. 8, M=3, and i=2.

As shown in FIG. 8, for the second-level optical switch k2, the input terminal is connected to the second output terminal of the first-level optical switch k1, the first output terminal is connected to the beam shaping module 22 in the optical path structure 80 to which the second-level optical switch k2 belongs, and the second output terminal is connected to the input terminal of the third-level optical switch k3.

A first output terminal of an $M^{th}$-level optical switch is connected to the beam shaping module 22 in the optical path structure 80 to which the $M^{th}$-level optical switch km belongs. An input terminal of the $M^{th}$-level optical switch is connected to a second output terminal of an $(M-1)^{th}$-level optical switch k(m−1).

A second output terminal of the $M^{th}$-level optical switch may be connected to a laser absorber 82 for absorbing light leaked in the optical path system.

As shown in FIG. 8, a first output terminal of the third-level optical switch k3 is connected to the beam shaping module 22 in the optical path structure 80 to which the third-level optical switch k3 belongs. The input terminal of the third-level optical switch k3 is connected to the second output terminal of the second-level optical switch k2. A second output terminal of the third-level optical switch k3 may be connected to a laser absorber 82.

In a specific implementation, the optical switch 81 may be a reflective mirror such as a rotating mirror. In this case, the optical switch 81 has two operating states, i.e., a first state and a second state respectively. In a specific implementation, it may be determined, according to position information of the target device a1, whether each optical switch 81 operates in the first state or the second state.

The operating states of the optical switches 81 may be the same or different and may be independently controlled.

In the first state, the input terminal and the first output terminal of the optical switch 81 are connected, and the input terminal and the second output terminal of the optical switch 81 are disconnected. That is, all rays incident to the optical switch 81 enter the optical path structure 80 to which the optical switch 81 belongs.

In the second state, the input terminal and the first output terminal of the optical switch 81 are disconnected, and the input terminal and the second output terminal of the optical switch 81 are connected. That is, all rays incident to the optical switch 81 enter the next-level optical switch 81 or the laser absorber 82.

Figure 9:
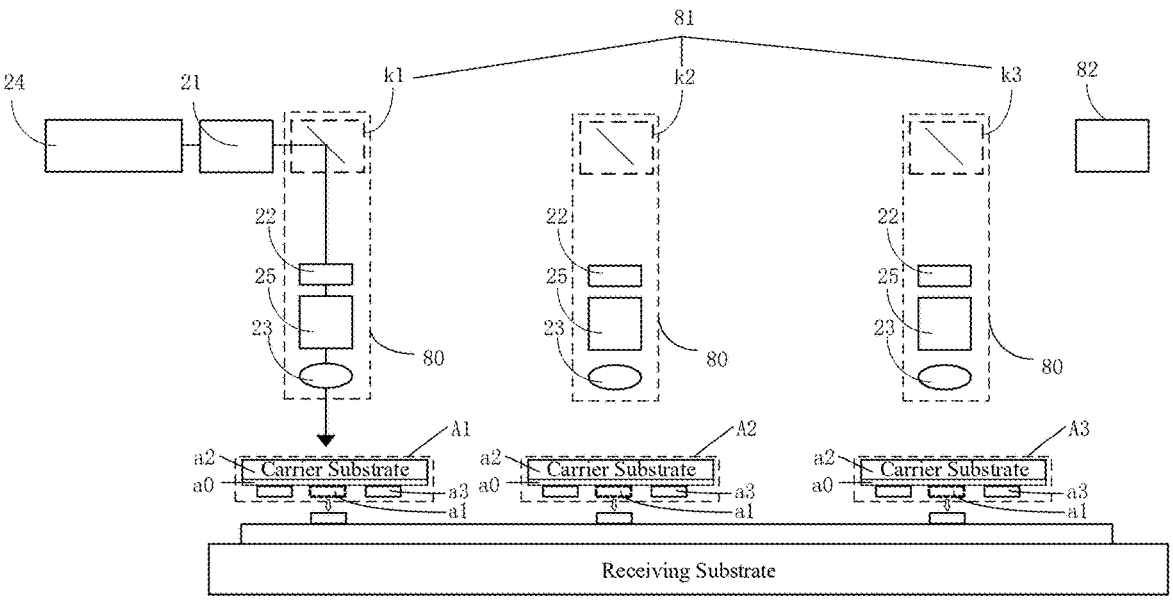
FIG. 9 is a schematic structural diagram illustrating one implementation of the first optical path system provided by the present disclosure in a first operating state.
Figure 10:
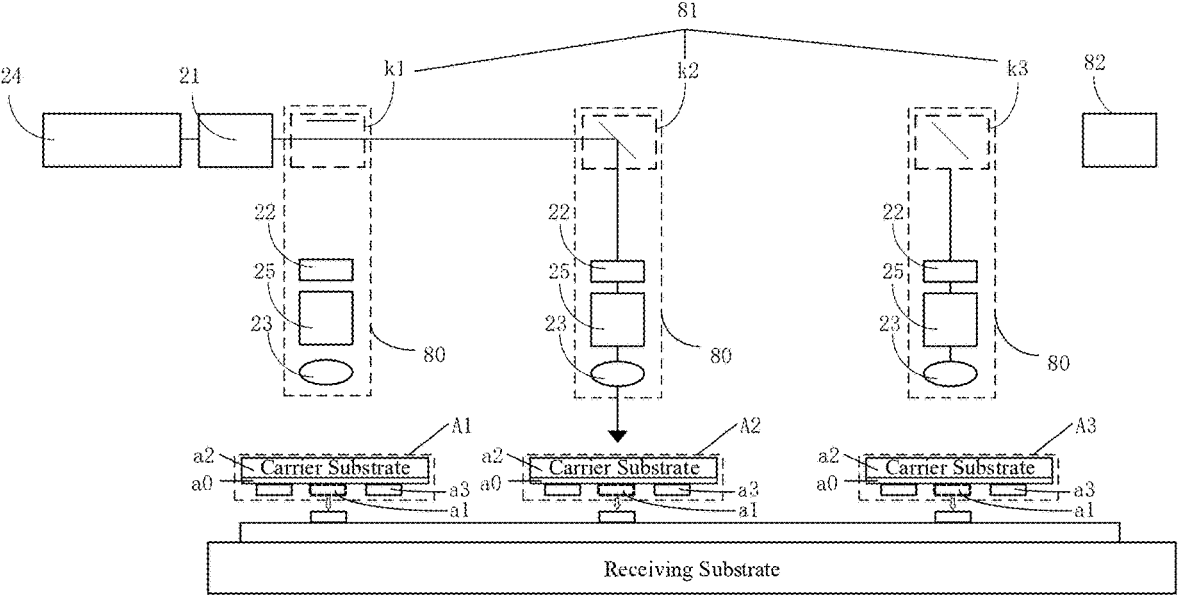
FIG. 10 is a schematic structural diagram illustrating one implementation of the first optical path system provided by the present disclosure in a second operating state.
Figure 11:
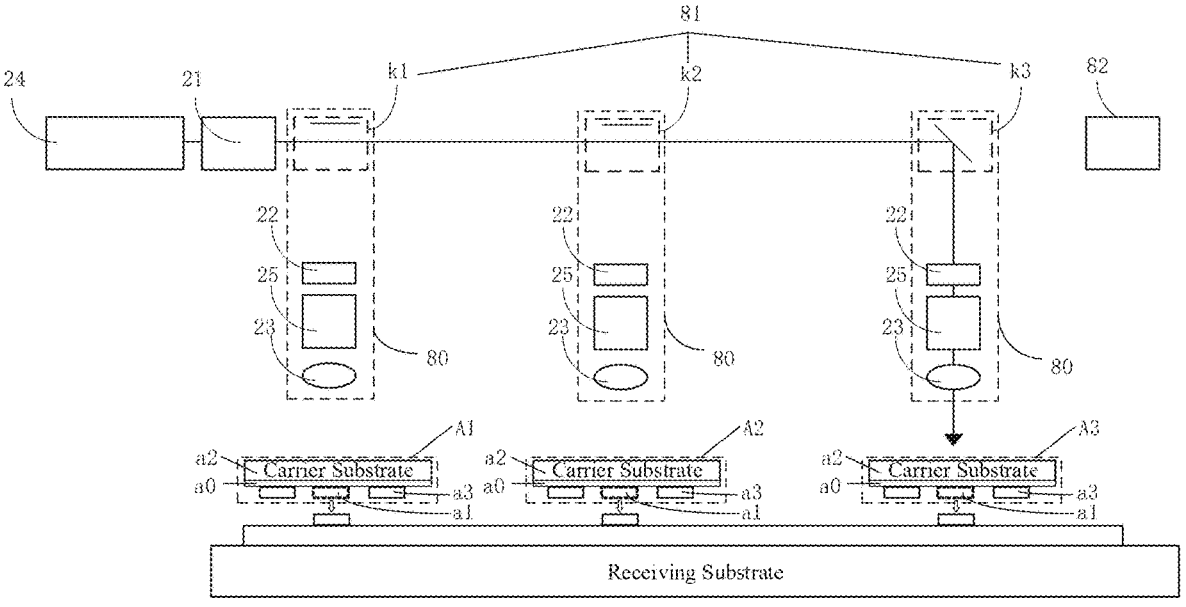
FIG. 11 is a schematic structural diagram illustrating one implementation of the first optical path system provided by the present disclosure in a third operating state.

As shown in FIG. 9 to FIG. 11, the optical path system includes three-level optical switches 81, and each level of optical switch 81 is a reflective mirror.

As shown in FIG. 9, the first-level optical switch k1 operates in the first state, and the second-level optical switch k2 and the third-level optical switch k3 operate in the second state. That is, a beam is totally reflected into the optical path structure 80 to which the first-level optical switch k1 belongs after passing through the first-level optical switch k1, and the output target light spot is used for processing a first device substrate A1.

As shown in FIG. 10, the second-level optical switch k2 operates in the first state, and the first-level optical switch k1 and the third-level optical switch k3 operate in the second state. That is, a beam is totally incident to the second-level optical switch k2 after passing through the first-level optical switch k1, the second-level optical switch k2 totally reflects the incident beam into the optical path structure 80 to which the second-level optical switch k2 belongs, and the output target light spot is used for processing a second device substrate A2.

As shown in FIG. 11, the third-level optical switch k3 operates in the first state, and the first-level optical switch k1 and the second-level optical switch k2 operate in the second state. That is, a beam is totally incident to the second-level optical switch k2 after passing through the first-level optical switch k1 and is totally incident to the third-level optical switch k3 after passing through the second-level optical switch k2, and the third-level optical switch k3 totally reflects the incident beam to the optical path structure 80 to which the third-level optical switch k3 belongs, and the output target light spot is used for processing a third device substrate A3.

The optical switch 81 may also be an element, such as a combination of a half-wave plate and a polarizing beam splitter or a combination of a half-wave plate and a metal wire grid polarizer, enabling a ray to be transmitted or reflected. In this case, the optical switch 81 has three operating states, i.e., the first state stated above, the second state stated above, and a third state respectively. In this case, the first state corresponds to that the beam is completely reflected after passing through the optical switch 81, the second state corresponds to that the beam is completely transmitted after passing through the optical switch 81, and the third state corresponds to that the beam is partially reflected and partially transmitted after passing through the optical switch 81.

In the third state, the input terminal and the first output terminal of the optical switch 81 are connected, and the input terminal and the second output terminal of the optical switch 81 are connected.

In a specific implementation, it may be determined, according to the position information of the target device a1, whether each optical switch 81 operates in the first state, the second state or the third state.

The operating states of the optical switches 81 may be the same or different and may be independently controlled.

Figure 12:
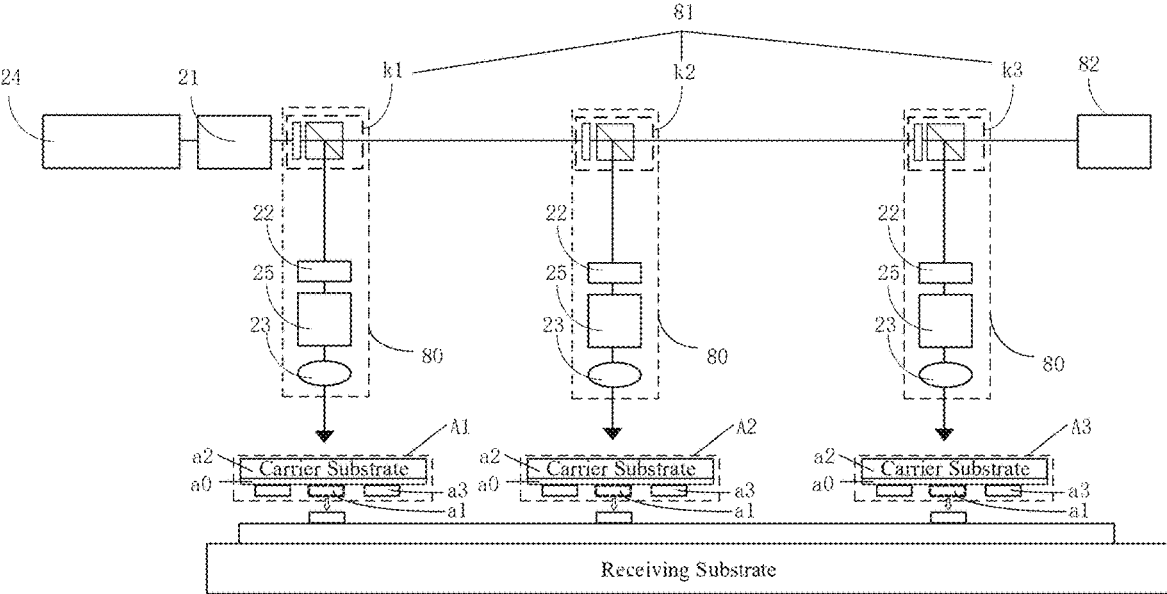
FIG. 12 is a schematic structural diagram illustrating another implementation of the first optical path system provided by the present disclosure in an operating state.

As shown in FIG. 12, the optical path system includes three-level optical switches 81, and each of the three-level optical switches 81 is a combination of a half-wave plate and a polarizing beam splitter.

In FIG. 12, the first-level optical switch k1 and the second-level optical switch k2 both operate in the third state, and the third-level optical switch k3 operates in the first state, and the optical path system may process the first device substrate A1, the second device substrate A2 and the third device substrate A3 at the same time.

The above-described optical switches 81 may be electrically controlled or manually controlled, which is not limited in the present disclosure.

It should be noted that M optical path structures 80 in the optical path system shown in FIG. 8 to FIG. 12 share the laser device 24 and the beam adjustment module 21, while the beam shaping module 22, the beam focusing module 23 and the position adjustment module 25 are respectively disposed in each of the optical path structures 80. In this way, the accuracy of the size and position of the target light spot may be improved, the matching degree between the target light spot and the target device a1 may be improved, it is ensured that the energy uniformity requirement of each target light spot is met, and the transfer yield may be increased.

In a specific implementation, the M optical path structures 80 in the optical path system shown in FIG. 8 to FIG. 12 may share one or more of the beam shaping module 22, the beam focusing module 23, the position adjustment module 25, the direction adjustment module 31, and the energy adjustment module 32, which is not limited in the present disclosure.

Figure 13:
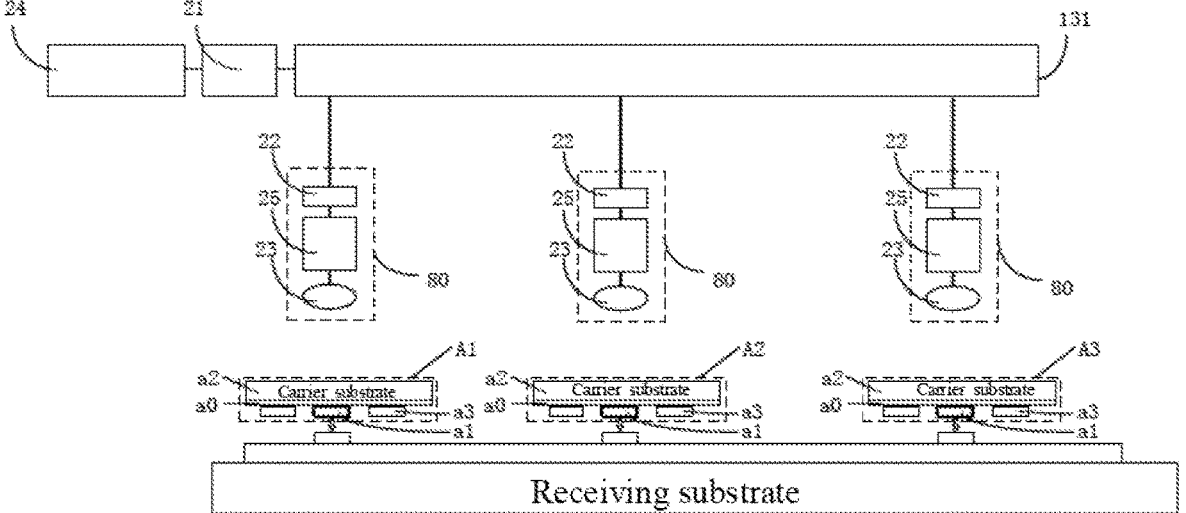
FIG. 13 is a schematic structural diagram illustrating a second optical path system provided by the present disclosure.

In a second implementation, referring to FIG. 13, the optical path system includes a beam splitting module 131 and N optical path structures 80, and the N optical path structures 80 share the beam adjustment module 21 and the beam splitting module 131.

The beam splitting module 131 is disposed between the beam adjustment module 21 and the beam shaping module 22 in each of the optical path structures 80, and is configured to split the first beam L1 into N sub-beams and enable the sub-beams to respectively enter the beam shaping modules 22 in different optical path structures 80.

N may be a positive integer greater than 1. In the optical path system shown in FIG. 13, N is 3.

An incident beam is split into N sub-beams by the beam splitting module 131, and each of the sub-beams is then incident to a beam shaping modules 22 in various optical path structures 80, so that N target light spots may be output at the same time, and the transfer yield may be increased.

Optionally, the beam splitting module 131 may be a diffractive beam splitter.

It should be noted that the N optical path structures 80 in the optical path system shown in FIG. 13 share the laser device 24, the beam adjustment module 21 and the beam splitting module 131, while the beam shaping module 22, the beam focusing module 23 and the position adjusting module 25 are respectively disposed in each of the optical path structures 80. In this way, the accuracy of the size and position of the target light spot may be improved, the matching degree between the target light spot and the target device a1 may be improved, the energy uniformity requirement of each target light spot may be met, and the transfer yield may be increased.

In a specific implementation, the N optical path structures 80 in the optical path system shown in FIG. 13 may further share one or more of the beam shaping module 22, the beam focusing module 23, the position adjustment module 25, the direction adjustment module 31, and the energy adjustment module 32, which is not limited in the present disclosure.

In the above-described embodiment, as shown in FIG. 8 to FIG. 13, the plurality of optical path structures 80 sharing the optical beam adjustment module 21 may form a subsystem. To further increase the area of one transfer, the optical path system may include a plurality of subsystems.

As shown in FIG. 8 to FIG. 13, the plurality of optical path structures 80 forming one subsystem may further share one laser device 24.

Figure 14:
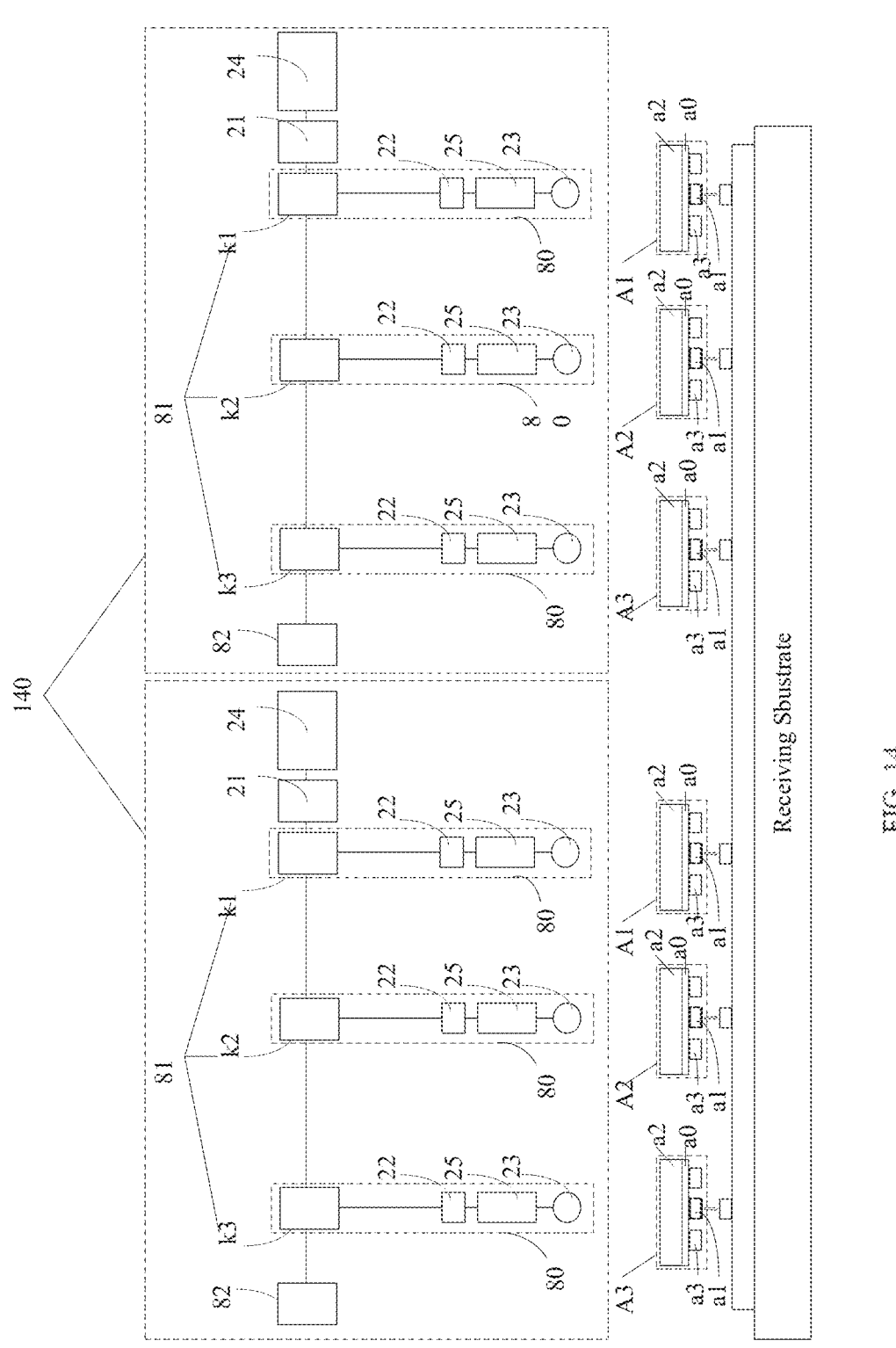
FIG. 14 is a schematic structural diagram illustrating a third optical path system provided by the present disclosure.

The optical path system shown in FIG. 14 includes two subsystems 140, and each of the subsystems 140 includes three optical path structures 80. Therefore, the optical path system shown in FIG. 14 may output six target light spots at the same time, so that the area of one transfer may be further increased to increase the transfer efficiency.

The present disclosure further provides a transfer method adopting the optical path system according to any one mentioned above. The transfer method includes steps S01~S02.

At step S01, a device substrate is provided, and the device substrate includes a target device, a carrier substrate, and a bonding material disposed between the target device and the carrier substrate.

At step S02, the optical path system is controlled to output a target light spot to irradiate the device substrate, so that the bonding material in the device substrate changes after being irradiated by the target light spot, enabling the target device to be separated from the carrier substrate.

In an optional implementation, step S02 may include step S11.

At step S11, the size and position of the target light spot are adjusted so that an orthographic projection of the target light spot on the device substrate covers the target device and does not overlap with other devices on the device substrate.

In a specific implementation, when a beam focusing module includes a focusing lens, the size of the target light spot may be adjusted by adjusting the magnification or minification of the focusing lens.

When the optical path structure includes a position adjustment module, a propagation direction of a beam may be changed by the position adjustment module so that the position of the target light spot is adjusted.

In an optional implementation, step S02 may include step S12.

At step S12, the energy of the target light spot is adjusted so that the energy density of the target light spot is greater than or equal to a first energy density and less than a second energy density; where the first energy density is an energy density enabling the bonding material to be decomposed or gasified, and the second energy density is an energy density enabling the bonding material to be denatured.

By providing an energy adjustment module in the optical path structure, the transmission rate of the beam may be changed by the energy adjustment module so that the energy of the target light spot is adjusted.

In an optional implementation, the optical path system is the optical path system shown in FIG. 8, the optical switches are reflective mirrors, then step S02 may include step S21~step S22.

At step S21, position information of the target device is acquired.

At step S22, each of the optical switches is controlled to operate in a first state or a second state according to the position information.

In the first state, an input terminal and a first output terminal of the optical switch are connected, and the input terminal and a second output terminal of the optical switch are disconnected; and in the second state, the input terminal and the first output terminal of the optical switch are disconnected, and the input terminal and the second output terminal of the optical switch are connected.

When reflective mirrors are used as optical switches, each of the optical switches has two operating states, and each of the optical switches may be respectively controlled to operate in the first state or the second state according to the position information of the target device. The operating states of the optical switches may be the same or different and may be independently controlled.

In an optional implementation, the optical path system is the optical path system shown in FIG. 8, each of the optical switches is a combination of a half-wave plate and a polarizing beam splitter, or each of the optical switches is a combination of a half-wave plate and a metal wire grid polarizer, then step S02 may include step S31~step S32.

At step S31, position information of the target device is acquired.

At step S32, each of the optical switches is controlled to operate in a first state, a second state or a third state according to the position information.

In the first state, an input terminal and a first output terminal of the optical switch are connected, and the input terminal and a second output terminal of each of the optical switch are disconnected; in the second state, the input terminal and the first output terminal of the optical switch are disconnected, and the input terminal and the second output terminal of the optical switch are connected; and in the third state, the input terminal and the first output terminal of the optical switches are connected, and the input terminal and the second output terminal of the optical switch are connected.

In the present implementation, the operating states of the optical switches may be the same or different and may be independently controlled.

When a combination of a half-wave plate and a polarizing beam splitter, or a combination of a half-wave plate and a metal wire grid polarizer is used as an optical switch, the optical switch has three operating states, and each of the optical switches may be controlled to operate in the first state, the second state or the third state according to the position information of the target device.

In a specific implementation, before step S02, the method may further include the following steps: a receiving substrate is provided; and the receiving substrate is aligned with the device substrate so that the target device separated from the carrier substrate is transferred to a target position on the receiving substrate.

When the optical path system includes a plurality of subsystems, the plurality of subsystems may operate at the same time or operate respectively according to a certain time sequence. Especially when the device substrate is greater in area and may receive the irradiation from the plurality of subsystems, by disposing the plurality of subsystems to respectively operate according to a certain time sequence, the interference among the plurality of subsystems may be avoided, the accuracy of the position of the target light spot on the device substrate may be improved, and the transfer quality and accuracy may be improved.

It should be noted that the transfer method may further include more steps, which may be determined according to actual needs and is not limited in the present disclosure. A detailed description and technical effect of the transfer method may refer to the above-mentioned description of the optical path structure and the optical path system, which will not be repeated herein.

Embodiments described in the present specification are described in a progressive way, each embodiment focuses on differences from other embodiments, and the same or similar parts of various embodiments may refer to each other.

Finally, it is further noted that relational terms such as first and second are merely used herein to distinguish one entity or operation from another entity or operation without necessarily requiring or implying any such actual relationship or order between such entities or operations. Furthermore, terms "comprising", "including", or any other variations thereof are intended to cover a non-exclusive inclusion, so that a process, method, commodity or apparatus that includes a list of elements not only includes those elements, but also includes other elements not explicitly listed or includes inherent elements of such a process, method, commodity or apparatus. In the case that there are no more restrictions, an element defined by a statement "includes a . . . " does not preclude the existence of additional identical elements in the process, method, commodity or apparatus that includes the element.

The optical path structure, the optical path system and the transfer method provided by the present disclosure have been introduced in detail as above, and specific examples have been used herein to explain the principles and implementations of the present disclosure. The description of the above embodiments is merely intended to help understand the method provided by the present disclosure and a core concept thereof. At the same time, those skilled in the art may, based on the concept of the present disclosure, make modifications with respect to the specific implementations and the application scope. In conclusion, the contents of the present specification should not be understood as limitations on the present disclosure.

Other implementation solutions of the present disclosure will be readily envisioned by those skilled in the art after considering the specification and putting the present disclosure disclosed herein into practice. The present disclosure is intended to cover any variations, purposes or adaptive changes of the present disclosure, and these variations, purposes or adaptive changes conform to a general principle of the present disclosure and include common general knowledge or conventional technical means in the undisclosed technical field of the present disclosure. The specification and the embodiments are merely regarded to be exemplary, and the true scope and spirit of the present disclosure are appointed by the following claims.

It should be understood that the present disclosure is not limited to precise structures which have been described above and shown in the accompanying drawings, and various modifications and alterations may be made without departing from the scope thereof. The scope of the present disclosure is merely limited by the appended claims.

The term "one embodiment", "an embodiment", or "one or more embodiments" referred herein means that a specific feature, structure, or characteristic described in conjunction with the embodiment is included in at least one embodiment of the present disclosure. In addition, it is noted that an example of the word "in one embodiment" described herein does not necessarily refer to the same embodiment.

In the specification provided herein, numerous specific details have been described. However, it may be understood that the embodiments of the present disclosure may be put into practice without these specific details. In some examples, the known methods, structures and technologies have not been shown in detail in order not to obscure the understanding of the present specification.

In claims, any reference numerals located between parentheses shall not be constructed as limitations on the claims. The word "comprising" does not exclude the existence of elements or steps which are not listed in the claims. The word "a" or "an" preceding an element does not exclude the existence of a plurality of such elements. The present disclosure may be implemented by means of hardware including several different elements and by means of a suitably programmed computer. In unit claims in which several devices are enumerated, several of these devices may be embodied by the same hardware item. The use of the words such as first, second and third does not denote any order. These words may be interpreted as names.

Finally, it should be noted that the above-mentioned embodiments are merely intended to illustrate the technical solutions of the present disclosure, rather than to limit them. Although the present disclosure has been described in detail with reference to the foregoing embodiments, those skilled in the art should understand that: the technical solutions recorded in the above-mentioned embodiments may still be modified, or parts of the technical features thereof may be equivalently substituted; and these modifications and substitutions do not enable the essences of the corresponding technical solutions to depart from the spirit and scope of the technical solutions in all the embodiments of the present disclosure.

The invention claimed is:

1. An optical path system, comprising M optical path structures and M-level optical switches cascaded with each other, wherein each of the M optical path structures comprises:

a beam adjustment module, configured to adjust a diameter of a laser beam and output a first beam;

a beam shaping module, configured to perform energy homogenization on the first beam to obtain a second beam; and a beam focusing module, configured to focus the second beam and output a target light spot;

wherein the target light spot is used for irradiating a device substrate, allowing a target device to be separated from a carrier substrate because a bonding material, after being irradiated by the target light spot, in the device substrate changes; wherein the bonding material is disposed between the target device and the carrier substrate;

wherein the M optical path structures share one beam adjustment module, the M-level optical switches are respectively disposed in the M optical path structures, and each of optical switches comprises an input terminal, a first output terminal, and a second output terminal;

wherein the input terminal of a first-level optical switch is connected to an output terminal of the beam adjustment module, and the first output terminal of the first-level optical switch is connected to the beam shaping module in the optical path structure to which the first-level optical switch belongs; the input terminal of an $i^{th}$-level optical switch is connected to the second output terminal of an $(i-1)^{th}$-level optical switch, the first output terminal of the $i^{th}$-level optical switch is connected to the beam shaping module in the optical path structure to which the $i^{th}$-level optical switch belongs, and the second output terminal of the $i^{th}$-level optical switch is connected to the input terminal of an $(i+1)^{th}$-level optical switch; the first output terminal of an $M^{th}$-level optical switch is connected to the beam shaping module in the optical path structure to which the $M^{th}$ level optical switch belongs;

M is a positive integer greater than 1, and i is greater than or equal to 2 and less than or equal to M−1.

2. The optical path system according to claim 1, wherein each of the optical switches is a reflective mirror, or each of the optical switches is a half-wave plate and polarizing beam splitter, or each of the optical switches is a half-wave plate and metal wire grid polarizer.

3. An optical path system, wherein the optical path system comprises a beam splitting module and N optical path structures, wherein each of the N optical path structures comprises:

a beam adjustment module, configured to adjust a diameter of a laser beam and output a first beam;

a beam shaping module, configured to perform energy homogenization on the first beam to obtain a second beam; and a beam focusing module, configured to focus the second beam and output a target light spot; wherein the target light spot is used for irradiating a device substrate, allowing a target device to be separated from a carrier substrate because a bonding material, after being irradiated by the target light spot, in the device substrate changes; wherein the bonding material is disposed between the target device and the carrier substrate;

wherein the N optical path structures share the one beam adjustment module and the beam splitting module;

wherein the beam splitting module is disposed between the beam adjustment module and the beam shaping module in each of the optical path structures, and is configured to split the first beam into N sub-beams and enable each of the sub-beams to respectively enter one of the beam shaping modules in the optical path structures, wherein N is a positive integer greater than 1.

4. The optical path system according to claim 3, wherein the beam splitting module is a diffractive beam splitter.

5. The optical path system according to claim 1, wherein the plurality of optical path structures sharing one beam adjustment module form a subsystem, and the optical path system comprises a plurality of the subsystems.

6. A transfer method, wherein the transfer method adopts an optical path system comprising M optical path structures and M-level optical switches cascaded with each other, wherein each of the optical path structures comprises: a beam adjustment module, configured to adjust a diameter of a laser beam and output a first beam; a beam shaping module, configured to perform energy homogenization on the first beam to obtain a second beam; and a beam focusing module, configured to focus the second beam and output a target light spot;

wherein the transfer method comprises:

providing a device substrate, wherein the device substrate comprises a target device, a carrier substrate, and a bonding material disposed between the target device and the carrier substrate; and controlling the optical path system to output the target light spot to irradiate the device substrate, allowing the target device to be separated from the carrier substrate because the bonding material, after being irradiated by the target light spot, in the device substrate changes;

wherein the M optical path structures share one beam adjustment module, the M-level optical switches are respectively disposed in the M optical path structures, and each of optical switches comprises an input terminal, a first output terminal, and a second output terminal; wherein the input terminal of a first-level optical switch is connected to an output terminal of the beam adjustment module, and the first output terminal of the first-level optical switch is connected to the beam shaping module in the optical path structure to which the first-level optical switch belongs; the input terminal of an $i^{th}$-level optical switch is connected to the second output terminal of an $(i-1)^{th}$-level optical switch, the first output terminal of the $i^{th}$-level optical switch is connected to the beam shaping module in the optical path structure to which the $i^{th}$-level optical switch belongs, and the second output terminal of the $i^{th}$-level optical switch is connected to the input terminal of an $(i+1)^{th}$-level optical switch; the first output terminal of an $M^{th}$-level optical switch is connected to the beam shaping module in the optical path structure to which the $M^{th}$-level optical switch belongs; M is a positive integer greater than 1, and i is greater than or equal to 2 and less than or equal to M−1;

wherein each of the optical switches is a reflective mirror, and the controlling the optical path system to output the target light spot comprises:

acquiring position information of the target device; and controlling each of the optical switches to operate in a first state or a second state according to the position information;

wherein in the first state, the input terminal and the first output terminal of the optical switch are connected, and the input terminal and the second output terminal of the optical switch are disconnected; and in the second state, the input terminal and the first output terminal of the optical switch are disconnected, and the input terminal and the second output terminal of the optical switch are connected; or wherein each of the optical switches is a half-wave plate and polarizing beam splitter, or each of the optical switches is a half-wave plate and metal wire grid polarizer, and the controlling the optical path system to output the target light spot comprises:

acquiring position information of the target device; and controlling each of the optical switches to operate in a first state, a second state or a third state according to the position information;

wherein in the first state, the input terminal and the first output terminal of the optical switch are connected, and the input terminal and the second output terminal of the optical switch are disconnected; in the second state, the input terminal and the first output terminal of the optical switch are disconnected, and the input terminal and the second output terminal of the optical switch are connected; and in the third state, the input terminal and the first output terminal of the optical switch are connected, and the input terminal and the second output terminal of the optical switch are connected.

7. The transfer method according to claim 6, wherein the controlling the optical path system to output the target light spot to irradiate the device substrate comprises at least one of:

adjusting the size and position of the target light spot, allowing an orthographic projection of the target light spot on the device substrate to cover the target device and not overlap with other devices on the device substrate; and adjusting the energy of the target light spot, allowing the energy density of the target light spot to be greater than or equal to a first energy density and less than a second energy density; wherein the first energy density is an energy density enabling the bonding material to be decomposed or gasified, and the second energy density is an energy density enabling the bonding material to be denatured.

8. The optical path system according to claim 3, wherein the plurality of optical path structures sharing one beam adjustment module form a subsystem, and the optical path system comprises a plurality of the subsystems.

9. The optical path system according to claim 1, wherein the beam adjustment module is a beam expander or a beam reducer.

10. The optical path system according to claim 1, wherein the beam shaping module comprises at least one of an optical diffractive element, an optical refractive element, and an optical reflective element.

11. The optical path system according to claim 1, wherein the beam focusing module is a focusing lens or a lens group consisting of a plurality of focusing lenses.

12. The optical path system according to claim 1, wherein the optical path structure further comprises:

a position adjustment module, disposed between the beam adjustment module and the beam shaping module, or disposed between the beam shaping module and the beam focusing module, or disposed on a light emitting side of the beam focusing module; wherein the position adjustment module is configured to change a propagation direction of a beam incident to the position adjustment module, allowing an orthographic projection of the target light spot on the device substrate to cover the target device.

13. The optical path system according to claim 12, wherein the position adjustment module comprises an optical reflective element.

14. The optical path system according to claim 1, wherein the optical path structure further comprises at least one of:

a laser device, configured to generate the laser beam;

at least one direction adjustment module, disposed between the beam adjustment module and the beam shaping module and configured to adjust a propagation direction of the first beam; and an energy adjustment module, disposed between the beam adjustment module and the beam shaping module and configured to adjust energy of the first beam.

15. The optical path system according to claim 14, wherein at least one of the following is met:

the direction adjustment module comprises a reflective mirror; and the energy adjustment module comprises a half-wave plate and a polarizing beam splitter.

16. The optical path system according to claim 1, wherein a size of the target light spot is greater than a size of the target device, and a boundary of the orthographic projection of the target light spot on the device substrate is protruded by a preset threshold relative to a boundary of the target device;

wherein the preset threshold is greater than or equal to zero and less than or equal to a half of a distance between the target device and an adjacent device, and the adjacent device is a device next to the target device in the device substrate.

17. The optical path system according to claim 1, wherein an energy density of the target light spot is greater than or equal to a first energy density and less than a second energy density;

wherein the first energy density is an energy density enabling the bonding material to be decomposed or gasified, and the second energy density is an energy density enabling the bonding material to be denatured.

18. The optical path system according to claim 3, wherein the beam adjustment module is a beam expander or a beam reducer; the beam shaping module comprises at least one of an optical diffractive element, an optical refractive element, and an optical reflective element; the beam focusing module is a focusing lens or a lens group consisting of a plurality of focusing lenses;

wherein the optical path structure further comprises: a position adjustment module, disposed between the beam adjustment module and the beam shaping module, or disposed between the beam shaping module and the beam focusing module, or disposed on a light emitting side of the beam focusing module; wherein the position adjustment module is configured to change a propagation direction of a beam incident to the position adjustment module, allowing an orthographic projection of the target light spot on the device substrate to cover the target device; wherein the position adjustment module comprises an optical reflective element;

wherein the optical path structure further comprises at least one of: a laser device, configured to generate the laser beam; at least one direction adjustment module, disposed between the beam adjustment module and the beam shaping module and configured to adjust a propagation direction of the first beam; and an energy adjustment module, disposed between the beam adjustment module and the beam shaping module and configured to adjust energy of the first beam;

wherein at least one of the following is met:

the direction adjustment module comprises a reflective mirror; and the energy adjustment module comprises a half-wave plate and a polarizing beam splitter;

wherein a size of the target light spot is greater than a size of the target device, and a boundary of the orthographic projection of the target light spot on the device substrate is protruded by a preset threshold relative to a boundary of the target device; wherein the preset threshold is greater than or equal to zero and less than or equal to a half of a distance between the target device and an adjacent device, and the adjacent device is a device next to the target device in the device substrate;

wherein an energy density of the target light spot is greater than or equal to a first energy density and less than a second energy density;

wherein the first energy density is an energy density enabling the bonding material to be decomposed or gasified, and the second energy density is an energy density enabling the bonding material to be denatured.

* * * * *